United States Patent
Martinez et al.

(10) Patent No.: US 8,637,983 B2
(45) Date of Patent: Jan. 28, 2014

(54) FACE-TO-FACE (F2F) HYBRID STRUCTURE FOR AN INTEGRATED CIRCUIT

(75) Inventors: Liane Martinez, North York (CA); Roden R. Topacio, Markham (CA); Yip Seng Low, Thornhill (CA)

(73) Assignee: ATI Technologies ULC, Markham, Ontario (CA)

( * ) Notice: Subject to any disclaimer, the term of this patent is extended or adjusted under 35 U.S.C. 154(b) by 562 days.

(21) Appl. No.: 12/339,759

(22) Filed: Dec. 19, 2008

(65) Prior Publication Data

US 2010/0155938 A1 Jun. 24, 2010

(51) Int. Cl.
*H01L 23/498* (2006.01)
*H01L 21/60* (2006.01)
*G06F 19/00* (2011.01)

(52) U.S. Cl.
USPC ........... 257/737; 257/734; 257/773; 257/777; 257/778; 257/779; 257/784; 257/786; 257/E23.068; 257/E23.072; 257/E23.142

(58) Field of Classification Search
USPC ......... 257/734, 737, 773, 777, 778, 779, 784, 257/786, E23.068, E23.072, E23.142
See application file for complete search history.

(56) References Cited

U.S. PATENT DOCUMENTS

| | | | |
|---|---|---|---|
| 6,057,598 A * | 5/2000 | Payne et al. | 257/723 |
| 6,166,556 A | 12/2000 | Wang et al. | |
| 6,207,548 B1 | 3/2001 | Akram et al. | |
| 6,506,672 B1 | 1/2003 | Dagenais et al. | |
| 6,555,460 B2 * | 4/2003 | Farnworth | 438/614 |
| 6,577,008 B2 * | 6/2003 | Lam et al. | 257/750 |
| 6,653,170 B1 | 11/2003 | Lin | |
| 6,734,556 B2 * | 5/2004 | Shibata | 257/737 |
| 2002/0079575 A1 * | 6/2002 | Hozoji et al. | 257/734 |
| 2003/0057559 A1 | 3/2003 | Mis et al. | |
| 2003/0134450 A1 * | 7/2003 | Lee | 438/106 |
| 2003/0141582 A1 * | 7/2003 | Yang et al. | 257/686 |
| 2004/0126927 A1 * | 7/2004 | Lin et al. | 438/107 |
| 2005/0017355 A1 * | 1/2005 | Chou et al. | 257/738 |
| 2006/0030139 A1 * | 2/2006 | Mis et al. | 438/612 |
| 2007/0126109 A1 | 6/2007 | Hashimoto | |
| 2007/0275503 A1 * | 11/2007 | Lin et al. | 438/106 |
| 2008/0177503 A1 | 7/2008 | Stockman | |
| 2008/0265413 A1 * | 10/2008 | Chou et al. | 257/737 |

FOREIGN PATENT DOCUMENTS

| | | |
|---|---|---|
| JP | 2007158043 | 6/2007 |
| WO | 0135462 | 5/2001 |
| WO | 2005008724 | 1/2005 |

OTHER PUBLICATIONS

International Search Report and Written Opinion from Canadian Patent Office; International Application No. PCT/CA2009/001861; dated Mar. 8, 2010.

Japanese Office Action; Japanese Application No. 2011-541051; dated Jun. 5, 2013.

* cited by examiner

*Primary Examiner* — Peniel M Gumedzoe
(74) *Attorney, Agent, or Firm* — Faegre Baker Daniels LLP

(57) ABSTRACT

An integrated circuit (IC) product includes a redistribution layer (RDL) having at least one conductive layer configured to distribute electrical information from one location to another location in the IC. The RDL also includes a plurality of wire bond pads and a plurality of solder pads. The plurality of solder pads each includes a solder wettable material that is in direct electrical communication with the RDL.

13 Claims, 9 Drawing Sheets

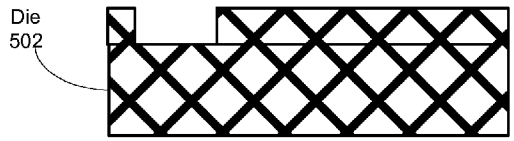
FIG. 5    (a) Start with Die
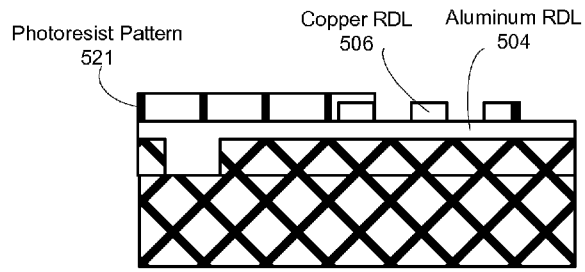
FIG. 9    (e) Develop PR pattern on Al pad to create RDL
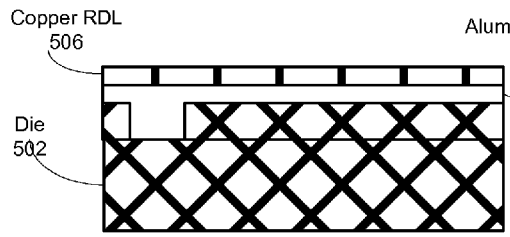
FIG. 6    (b) Add Al and Cu RDL layers
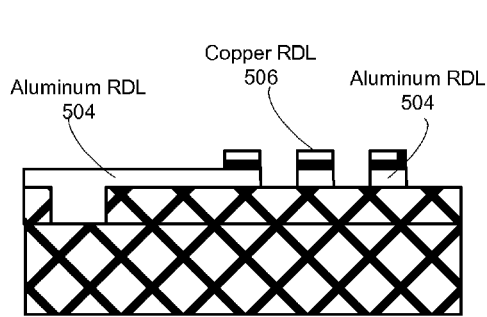
FIG. 10    (f) Etch out Al with etching solution not reacting to Copper
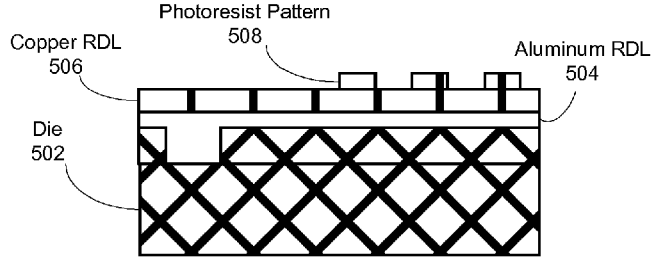
FIG. 7    (c) Develop PR pattern on C4 area
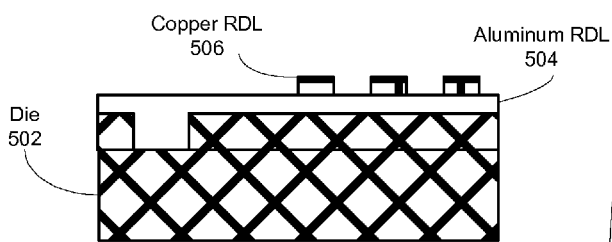
FIG. 8    (d) Etch out Cu with Etching solution not reacting to Al
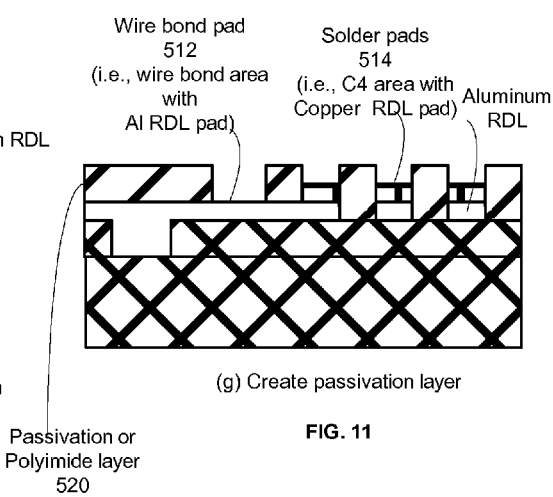
(g) Create passivation layer
FIG. 11

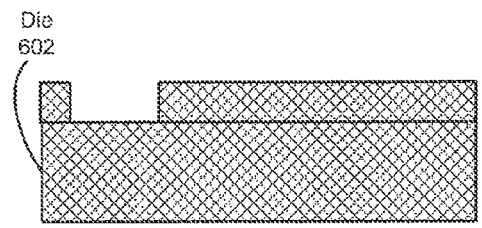
FIG. 12    (a) Start with Die
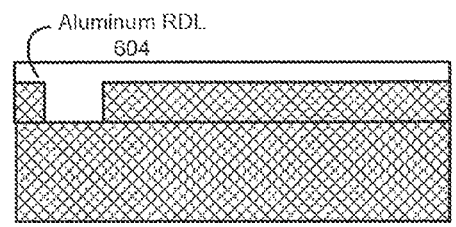
FIG. 13    (b) Add Al RDL layer
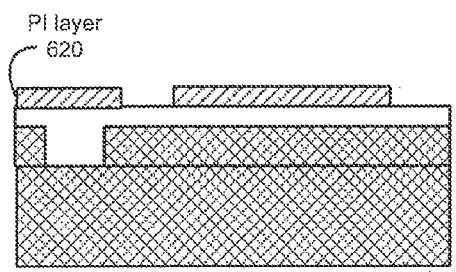
FIG. 14    (c) Create passivation or PI layer in order to protect the AL RDL from the chemical processes
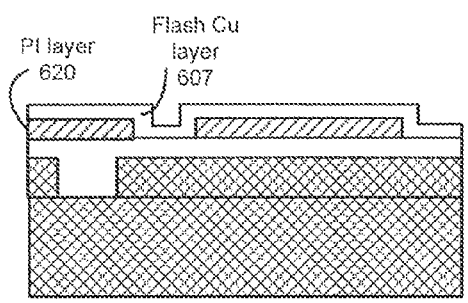
(d) Apply Flash Cu layer
FIG. 15
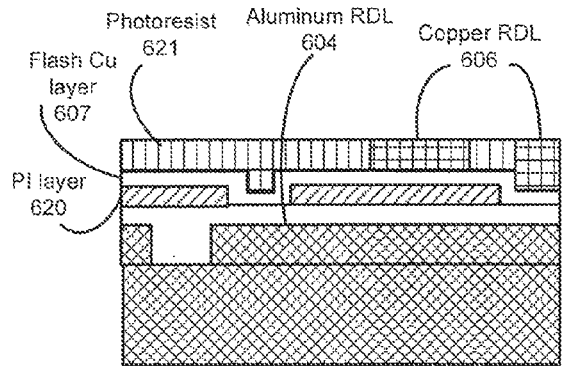
FIG. 16    (e) PR and Cu RDL plating
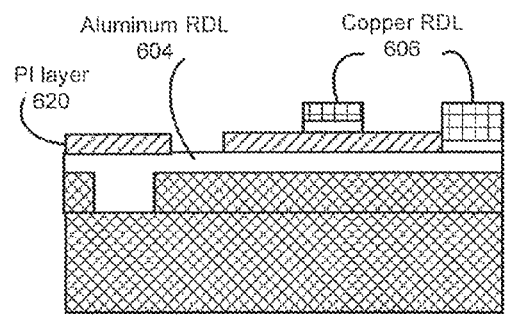
FIG. 17    (f) PR removal and Flash Cu etching
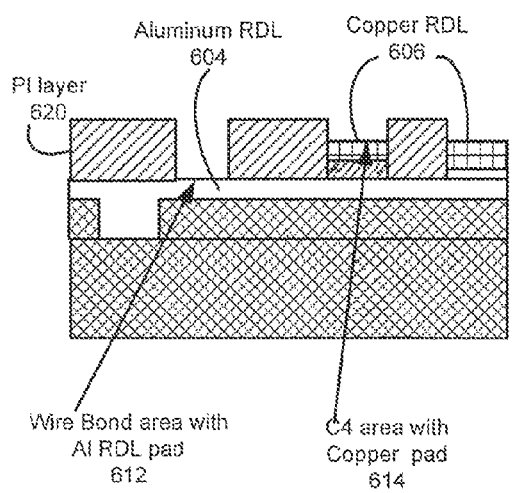
FIG. 18    (g) Create passivation layer

FACE-TO-FACE (F2F) HYBRID STRUCTURE FOR AN INTEGRATED CIRCUIT

FIELD OF THE INVENTION

The present invention relates generally to integrated circuit packaging, and more particularly, to a method, system and apparatus that employs hybrid packaging.

BACKGROUND OF THE INVENTION

The demand for small sized portable communication devices such as cellular telephones, handheld devices, memory cards, smart cards, etc. has lead to a need to develop smaller integrated circuit packages (although use of such small size IC packages are also applicable to larger devices like notebooks, laptops, desktops, game consoles, DTVs, workstations, servers and other computing devices). However, as these communication devices shrink in size, integrated circuit packages must also be reduced both in thickness and in footprint. Reducing die thickness is an important consideration in reducing package dimensions (such as thickness and footprint). To accomplish this, some die stacking solutions are currently being implemented. Die stacking refers to a process of mounting multiple chips on top of each other within a single integrated circuit/semiconductor package. Die stacking, also referred to as "chip stacking", significantly increases the amount of silicon chip area that can be housed within a single package of a given footprint to, thus, conserve precious real estate on a printed circuit board and simplify a board assembly process.

Current solutions that employ die stacking are known to use either a stack wire bond device or a hybrid package. Stack wire bond can be used in a package that combines several dies vertically in a chip scale package and electrically interconnects them to form a single device. Stacked multichip packaging methodologies have recently become a means in helping system designers restrain the size, weight, power consumption, and cost of small, portable, and wireless consumer devices. However, for some complex designs, there can be difficulties in routing numerous wire bonds when the dimensions of the package are constrained.

One method to try to overcome these difficulties involves die stacking in hybrid packages. A hybrid package refers to a special carrier of hybrid microcircuits and components interconnected as one unit. It can be considered a component of an electronic subsystem. The hybrid package may consist of a single construction or be made up of sub-modules. Each module usually contains a compartment to house the hermetically packaged hybrids and discrete passive component parts such as transformers, resistors, etc. However, some of the challenges facing hybrid packages are that as the die sizes are continually being pushed down, the input/output requirements are continually getting bigger.

Thus, although wire bond dies and flip chip dies have been employed in some stack die small packaging applications, the inefficiencies in current available arrangements have limited the amount of I/O counts that may be derived from such packaging. A flip-chip is a semiconductor device typically in the form of a die mounted directly onto a substrate (e.g., a carrier) in a "face-down" manner. An electrical connection is achieved through conductive bumps attached to the surface of the die. During mounting, the chip is flipped on the substrate (hence the name "flip-chip"), with bumps being positioned on respective target locations. In one method, the chip is placed face down so the solder bumps on the chip are aligned and contact bond pads on the package.

The device is reflowed (heated) so that the solder bumps and bond pads form metallurgical bonds. Flip-chips are typically smaller than conventional chips because they do not require wirebonds.

Stacked dies may be interconnected using wirebonding alone, or by a combination of wirebonding and flipchip assembly. The use of wirebonding as the exclusive means of interconnection is somewhat restrictive, since the number of stacked dies that may be wirebonded may be very limited.

Moreover, conventional redistribution layers (RDLs) are known in art. Redistribution layers are known to facilitate the redistribution (or relocation) of electrical signals, power and ground information, from one location to another location within an integrated circuit. Such conventional redistribution layers are known to have pads that can be suitable for only solder pad connections. Other conventional redistribution layers are known to have pads that can be suitable for only wire bond connections. Perhaps due to metallization challenges, none of current redistribution layer structures are known to include both solder pad connections and wire bond connections on the same substrate. Such limitations are of concern since advances in chip scale packaging, wafer-level packaging, 3-D packaging, and system-in-package often require redistributed bond pads. Thus, conventional RDL structures need to use multiple substrates in order to achieve desired solder pad and wire bond connections. Having multiple layered substrates in the same package can be expensive, and can defeat a goal of shrinking the sizes of communication devices.

Thus, such conventional techniques of integrating more peripheral devices onto a single monolithic chip to achieve improved performance but being restricted by inefficient ways of interconnecting these devices has resulted in higher power consumption in such devices. It is therefore desirable to provide, among other things, an improved integrated circuit.

BRIEF DESCRIPTION OF THE DRAWINGS

The disclosure will be more readily understood in view of the following description when accompanied by the below figures, wherein like reference numerals represent like elements:

FIGS. 5-11 illustrate a cross-sectional structural view of a process for manufacturing an F2F hybrid integrated circuit in accordance with an embodiment of the present disclosure.

FIGS. 12-18 illustrate cross-sectional structural views of another process for manufacturing an F2F hybrid integrated circuit in accordance with an embodiment of the present disclosure.

DETAILED DESCRIPTION OF THE PREFERRED EMBODIMENTS

Figure 1:
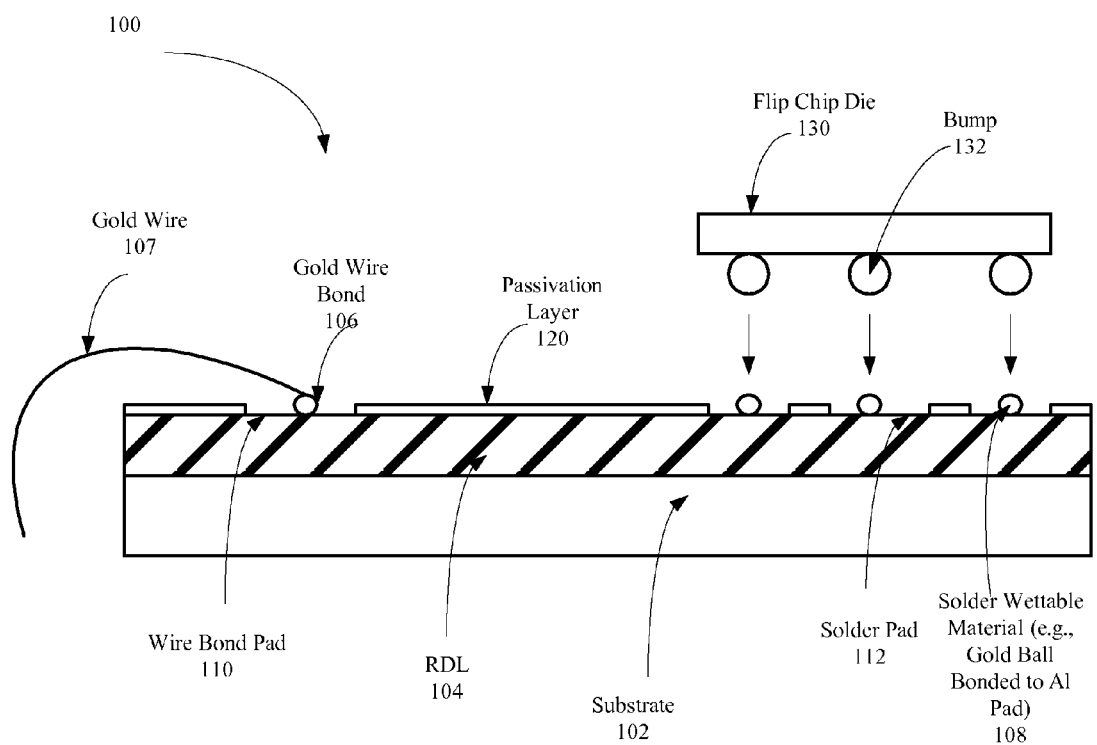
FIG. 1 illustrates a cross-sectional view of an exemplary face-to-face (F2F) hybrid structure of an integrated circuit in accordance with an embodiment of the present disclosure.

In one example, an integrated circuit product includes a redistribution layer (RDL) having at least one conductive layer configured to distribute electrical information from one location to another location in the IC. The RDL also includes a plurality of wire bond pads and a plurality of solder pads. The plurality of solder pads each includes a solder wettable material that is in direct electrical communication with the RDL.

Among other advantages, the integrated circuit product, assembly and method is a definable structure that provides improved space savings and electrical performance over known integrated circuit products, assembly and methods employing conventional die stacking. The die stacking structure may also help provide shorter routing of interconnections between circuits resulting in faster signal propagation and reduction in noise and cross-talk. Such die stacking structures also provide improved flexibility for system designers that desire to alter pad pitches. Further, costs are reduced by minimizing the number of substrates that can be used to form an RDL that includes a plurality of wire bond pads and a plurality solder pads. Other advantages will be recognized by those of ordinary skill in the art.

In one example, the integrated circuit includes a plurality of wire bond pads that are adapted to each receive a gold wire bond, and the plurality of solder pads are adapted to receive a plurality of solder bumps associated with a flip chip. For example, the solder pad area can include gold ball bonds that permit reflow of the plurality of solder bumps on the aluminum RDL. The gold wire can be comprised of pure gold wire bond (having minor impurities in some cases). Of course, a suitable gold alloy wire such as gold/silver alloy wire can be used, if desired. The RDL can be comprised of pure aluminum (having minor impurities in some cases). Of course, a suitable aluminum alloy such as an Al/Cu alloy can be used, if desired. The solder wettable material includes gold that permits reflow of the plurality of solder bumps on the aluminum RDL. In another example, the solder wettable material includes a layer of copper.

In one example, an integrated circuit includes a redistribution layer (RDL) having both at least a plurality of wire bond pads and a plurality of solder pads. The RDL is configured to include a layer of silver having the plurality of wire bond pads and the plurality of solder pads. The RDL can be comprised of pure silver (having minor impurities in some cases). Of course, a suitable silver alloy such as silver/cu alloy can be used, if desired. The aluminum layer is disposed below the layer of silver and is in electrical contact therewith. The integrated circuit also includes a flip chip having a plurality of solder bumps for mounting to the plurality of solder pads of the RDL. The plurality of solder pads permit solder reflow of the plurality of bumps to the silver RDL.

In one example, an integrated circuit assembly includes a substrate having a top surface and a bottom surface. The integrated circuit assembly also includes a first die, wirebonded to the top surface of the substrate. The first die includes a first redistribution layer (RDL) having both at least a plurality of wire bond pads and a plurality of solder pads. The integrated circuit assembly also includes a second die that is operatively coupled to the first die via the RDL via a plurality of bumps.

In one example, the second die is configured with a second redistribution layer having a plurality of solder pads that permits reflow of the plurality of bumps. The plurality of bumps are disposed in a non-peripheral orientation on the second die and are comprised of eutectic bumps. In another example, the plurality of bumps are disposed on a periphery of the second die, and include at least a plurality of copper stud bumping and/or a plurality of gold stud bumping. In one example, the first RDL is configured with aluminum.

In one example, a method of making an integrated circuit product includes forming, on a substrate (e.g., die substrate), an aluminum redistribution layer (RDL) having both at least a plurality of wire bond pads and a plurality of solder pads, and providing solder wettable material at the plurality of solder pads locations.

In one example, the providing of solder wettable material includes placing gold balls at the solder pad locations to permit reflow of a plurality of bumps at the solder pad locations. In another example, the providing includes forming a layer of copper RDL at the solder pad location to permit solder reflows of a plurality of bumps to the copper RDL.

In one example, a process of making an integrated circuit product includes forming an aluminum redistribution layer (RDL) on a wafer. A passivation layer is then created on the aluminum RDL such that the passivation layer includes a plurality of openings for wire bond and solder connections to the aluminum RDL. The wafer is then diced to individual dies. Each diced die is attached to a substrate (e.g., package substrate). Thereafter, gold wire is bonded to each of the openings configured for wire bonding and solder wettable material is provided to the openings configured for solder connections. A plurality of bumps associated with a flip chip are then attached to the solder material.

In one example, the solder wettable material includes plurality of gold balls that permit reflow of a plurality of bumps on the aluminum RDL. In another example, the solder wettable material includes a layer of copper RDL that permits solder reflows of the plurality of bumps to the copper RDL. In yet another example, the solder wettable material includes a layer of silver RDL that permits solder reflows of a plurality of bumps to the silver RDL.

As used herein, the term "circuit" or "module" can include an electronic circuit, one or more processors (e.g., shared, dedicated, or group of processors such as but not limited to microprocessors, DSPs, or central processing units) and memory, that execute one or more software or firmware programs, combinational logic circuits, an ASIC, and/or other suitable components that provide the described functionality. A "circuit" or "module" can be "powered down" by reducing power to a desired reduced power level including to a level rendering it inoperative. Likewise, a "circuit" or "module" can be "powered up" by increasing its supply power to a level rendering it operative. Additionally, as will be appreciated by those of ordinary skill in the art, the operation, design, and organization, of a "circuit" or "module" can be described in a hardware description language such as Verilog™, VHDL, or other suitable hardware description languages.

FIG. 1 illustrates a cross-sectional view of an exemplary face-to-face (F2F) hybrid structure of an integrated circuit 100 that employs a redistribution layer (RDL) 104 having at least one conductive layer that distributes electrical information from one location to another location in the IC. In this example, the RDL 104 includes a plurality of wire bond pads 110 and a plurality of solder pads 112. The RDL 104 surface is constituted so as to allow gold wire 107 to bond on it and also allow flip chip bumps 132 to reflow on the RDL 104. The RDL 104 is formed on a substrate 102. As used herein, "reflow" refers to the melting of solder such as electrodeposited tin or lead that is followed by solidification, as known in the art. The plurality of solder pads 112 each includes a solder wettable material 108 that is in direct electrical communication with the RDL 104.

In one example, the integrated circuit includes a plurality of wire bond pads 110 that are adapted to each receive gold wire bond 106, and the plurality of solder pads 112 can each be adapted to receive a plurality of solder bumps 132 associated with a flip chip 130. The RDL can be comprised of pure aluminum (having minor impurities in some cases). Of course, a suitable aluminum alloy such as Al/Cu alloy can be used, if desired. The solder wettable material includes gold ball bond that permits reflow of the plurality of solder bumps on the aluminum RDL. In another example, the solder wettable material is comprised of a layer of copper. Gold can more easily bond on a surface that is comprised of aluminum RDL. Solder does not have good wetting on an aluminum surface. Thus, gold balls can be bonded to the aluminum surface on the C4 pad areas so that bumps associated with a flip chip can reflow on the gold area for good connection. As used herein, "C4" is an acronym that refers to controlled collapse chip connection, and is a technique for interconnecting semiconductor devices, such as IC chips and MEMS, to external circuitry with solder bumps that have been deposited onto the chip pads. The solder bumps are deposited on the chip pads on the top side of the wafer during the final wafer processing step. In order to mount the chip to external circuitry (e.g., a circuit board or another chip or wafer), the flip chip is flipped over so that its top side faces down, and aligned so that its pads align with matching pads on the external circuit, and then the solder is flowed to complete the interconnect. This is in contrast to wire bonding, in which the chip is mounted upright and wires are used to interconnect the chip pads to external circuitry.

Further, a portion of the RDL 104 can be coated with a passivation layer 120 to help protect the RDL 104 from contamination. The passivation layer 120 can also include a polyimide material. Passivation is a process of making a material "passive" in relation to another material, and thus, can help protect the material. Such passivation techniques are well known and can also help protect the aluminum RDL 104 from, for example, future corrosion. Passivation techniques can be used in that although pure aluminum naturally forms an oxide that almost immediately protects it from further oxidation in most environments, aluminum alloys tend to offer little protection from corrosion.

Figure 2:
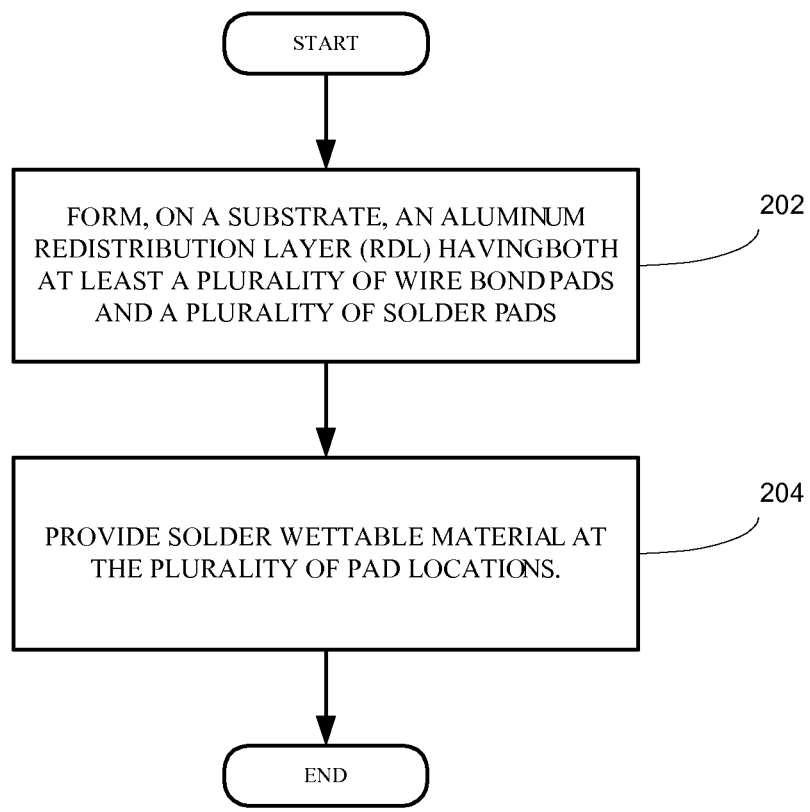
FIG. 2 illustrates in flow-chart form a method for making a F2F hybrid structure of an integrated circuit product in accordance with an embodiment of the present disclosure.

FIG. 2 illustrates in flow-chart form a method for making an F2F hybrid structure of an integrated circuit product that employs an aluminum redistribution layer (RDL). Such an aluminum RDL can be configured with at least one conductive layer that distributes electrical information from one location to another location in the integrated circuit. In operation 202, an aluminum redistribution layer (RDL) having both at least a plurality of wire bond pads and a plurality of solder pads is formed on a substrate. Thereafter, in operation 204, solder wettable material can be provided at the plurality of solder pad locations.

In one example, such providing of the solder material can include placing gold balls at the solder pad locations to permit reflow of a plurality of bumps at the solder pad locations. Such placing can involve a gold ball bonding technique, or other known techniques that are well known in the art. In another example, (see e.g., FIGS. 12-18) the providing of solder wettable material may include forming a layer of copper RDL at the solder pad location to permit solder reflows of a plurality of bumps to the copper RDL.

Figure 3:
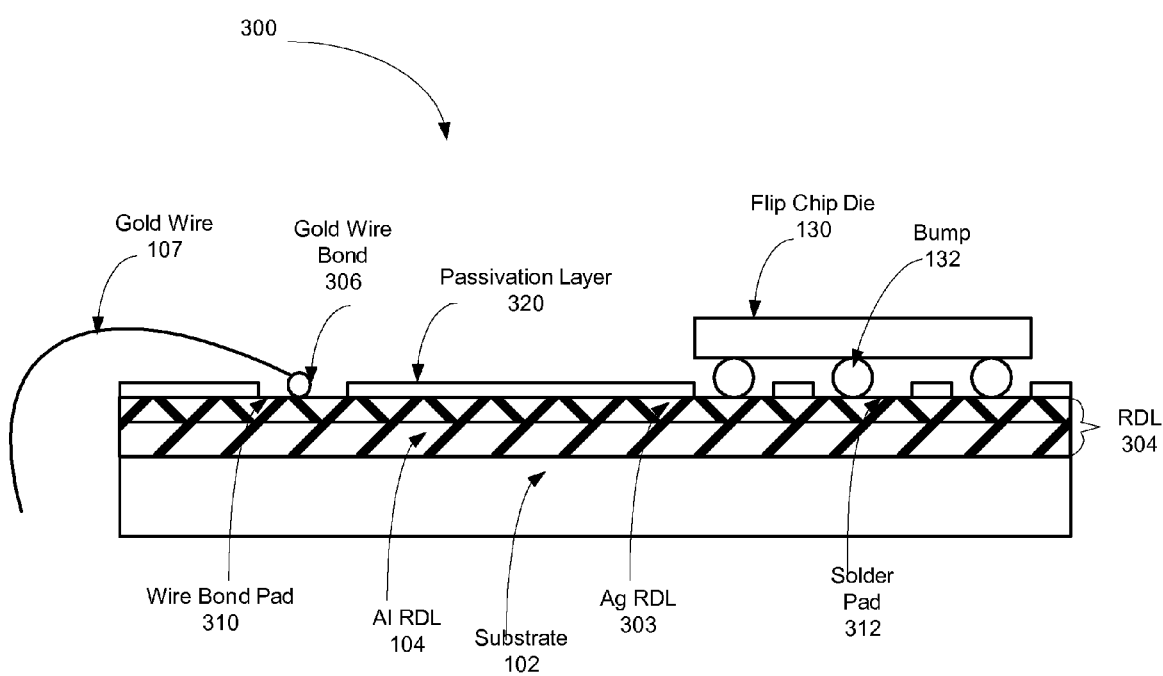
FIG. 3 illustrates a cross-sectional view of another embodiment of a F2F hybrid structure of an integrated circuit in accordance with an embodiment of the present disclosure.

FIG. 3 illustrates a cross-sectional view of another embodiment of a F2F hybrid structure of an integrated circuit 300 that employs a redistribution layer (RDL) 304 having both at least a plurality of wire bond pads 310 and a plurality of solder pads 312. In this embodiment, the RDL 304 is configured to include a layer of silver 303 having the plurality of wire bond pads 310 and the plurality of solder pads 312. The silver RDL can be comprised of pure silver (having minor impurities in some cases). Of course, a suitable silver alloy such as Ag/Cu alloy can be used, if desired. The aluminum RDL layer 104 is disposed below the redistribution layer of silver 303 and is in electrical contact therewith. The aluminum RDL can be comprised of pure aluminum (having minor impurities in some cases). Of course, a suitable aluminum alloy such as Al/Cu alloy can be used, if desired. The silver RDL surface can allow gold wire to bond on it as well as allow the flip chip solder bumps 130 to reflow on it. Thus, the integrated circuit also includes a flip chip 130 having a plurality of solder bumps 132 for mounting to the plurality of solder pads 312 of the RDL 304. The plurality of solder pads 312 permits solder reflows of the plurality of bumps 132 to the silver RDL 303. Further, the RDL 304 can be coated with a passivation layer 320 to help protect the silver RDL 304 from contamination. The passivation layer 320 can also include a polyimide material.

Figure 4:
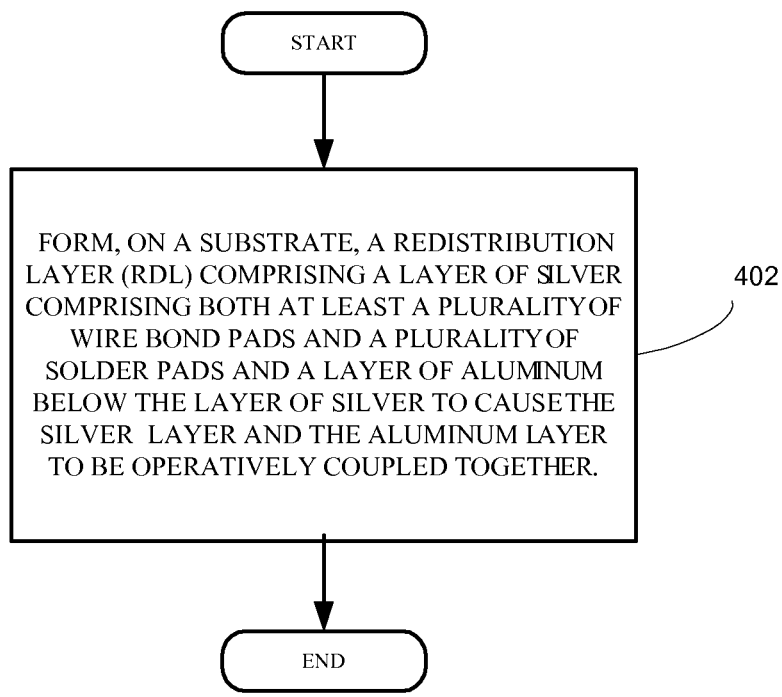
FIG. 4 illustrates in flow-chart form a method for making an F2F hybrid integrated circuit product in accordance with an embodiment of the present disclosure.

FIG. 4 illustrates in flow-chart form a method for making an F2F hybrid integrated circuit product that employs both an aluminum redistribution layer (RDL) and a silver RDL. Both the aluminum RDL and the silver RDL can be configured with at least one conductive layer that distributes power and enables ground contacts. In operation 402, a redistribution layer that includes a layer of silver having both a plurality of wire bond pads and a plurality of solder pads, and a layer of aluminum below the layer of silver, are formed on a substrate, so as to cause the silver layer and the aluminum layer to be operatively coupled together. The integrated circuit also includes a flip chip having a plurality of solder bumps for mounting to the plurality of solder pads of the silver RDL. The plurality of solder pads permit solder reflows of the plurality of bumps to the silver RDL.

FIGS. 5 to 11 illustrate a cross-sectional structural view of a process for manufacturing of an F2F hybrid integrated circuit that employs an aluminum redistribution layer (RDL) having both at least a plurality of wire bond pads, and a copper RDL having a plurality of solder pads. Such an integrated circuit can allow gold wire to bond on the wire bond pads, and also allow flip chip bumps to reflows on the solder pads. This process employs a selective etching solution that selectively etches aluminum or copper only. In FIG. 5, the process starts with a die 502. Such a die 502 can be a suitable block of semiconducting material, on which a given functional circuit (or circuits) is to be fabricated. In FIG. 6, aluminum RDL 504 and copper RDL 506 are formed on the die 502. This can be accomplished by, for example, deposition techniques that are well known in the art. As used herein, deposition refers to any process that grows, coats, or otherwise transfers a material onto a wafer. Such deposition techniques can include, but are not limited to, physical vapor deposition (PVD), chemical vapor deposition (CVD), electrochemical deposition (ECD), molecular beam epitaxy (MBE) and/or atomic layer deposition (ALD) among others. The aluminum RDL 504 and copper RDL can also be formed using sputtering techniques, plating techniques, or other suitable techniques that are well known in the art. In FIG. 7, a photoresist pattern 508 is developed on selected sections of the copper RDL 506. The photoresist employed herein can be any suitable substance that can be used to mask electrical circuits before chemical etching. Such photoresist can be made to form a tough film by photographic process. In FIG. 8, a suitable etching solution is employed to selectively etch out exposed portions copper RDL 506. Such an etching solution etches copper but does not etch or react to aluminum. This involves techniques that can include the adjusting etching rate and the combination of etching chemicals, which can be proprietary to manufacturing houses. In FIG. 9, a photoresist pattern 521 is developed to mask selected portions of the aluminum RDL 504. In FIG. 10, unmasked portions of the aluminum RDL 504 are then etched out by a solution that etches aluminum but does not react to copper. This involves techniques that can include the adjusting etching rate and the combination of etching chemicals, which can be proprietary to manufacturing houses. Thereafter, in FIG. 11, a passivation layer 520 is created on the integrated circuit structure. As shown, a plurality of wire bond pads 512 having aluminum RDL 504 are created. Also, a plurality of solder pads 514 having copper RDL are created in the C4 portion of the integrated.

FIGS. 12-18 illustrate embodiments of cross-sectional structural views of another process for manufacturing an F2F hybrid integrated circuit that employs an aluminum redistribution layer (RDL) having both at least a plurality of wire bond pads, and a copper RDL having a plurality of solder pads. Such an integrated circuit can allow gold wire to bond on the wire bond pads, and also allow flip chip bumps to reflows on the solder pads. This process employs passivation and polyimide layer to protect the aluminum RDL from various chemicals utilized during manufacture. In FIG. 12, the process starts with a die 602. Such a die 602 can be a suitable block of semiconducting material, on which a given functional circuit (or circuits) is to be fabricated. In FIG. 13, aluminum RDL 604 is formed on the die 602 using conventional techniques discussed above. In FIG. 14, a passivation or polyimide layer 620 is created on the aluminum RDL 604 so as to protect the aluminum RDL 604 from various chemicals utilized during manufacture. Thereafter, as illustrated in FIG. 15, a flash copper layer 607 is formed above the passivation layer 620. Such flash copper layer 607 can be a thin copper layer that is electroplated or sputtered directly above the passivation layer 620. In electroplating, an ionic metal (e.g., copper) is supplied with electrons to form a non-ionic coating or substrate. In FIG. 16, copper RDL 606 can be formed or deposited above the flash copper layer 607, by a plating process which is well known in the art. A photoresist 621 pattern is developed on selected sections of the flash copper layer 607. The photoresist 621 employed herein can be any suitable substance that can be used to mask electrical circuits before chemical etching. Such photoresist 621 can be made to form a tough film by photographic process. In FIG. 17, a suitable etching solution, such as hydrofluoric acid (HF), is employed to selectively etch out exposed portions of the flash copper layer 607. The photoresist is also removed at this stage. In FIG. 18, a passivation layer 620 is created on the integrated circuit structure. As shown in FIG. 18, a plurality of wire bond pads 612 having aluminum RDL 604 are created. Also, a plurality of solder pads 614 having copper RDL are created in the C4 portion of the integrated.

Figure 19:
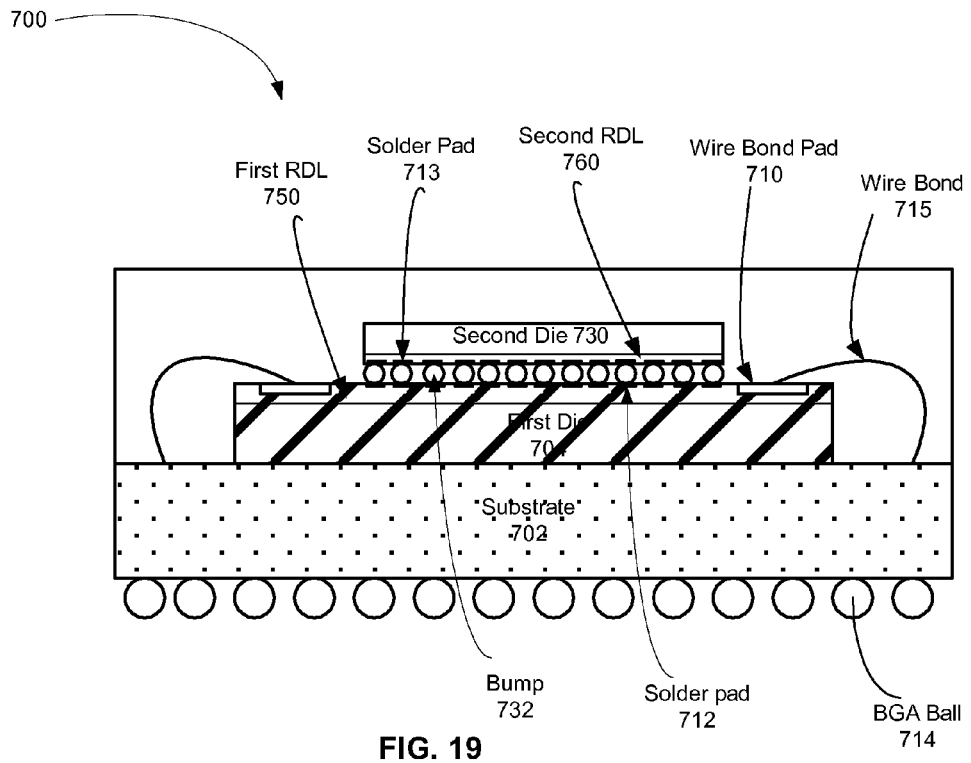
FIGS. 19 and 20 illustrate an exemplary F2F hybrid integrated circuit assembly in accordance with an embodiment of the present disclosure.
Figure 20:
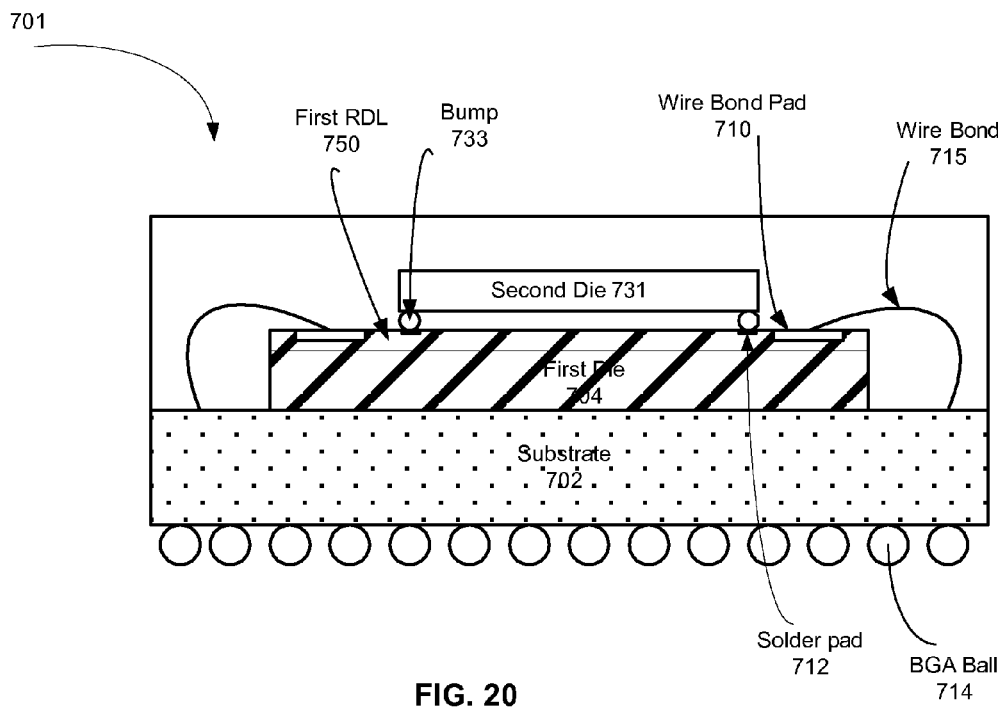

FIGS. 19 and 20 illustrate an exemplary F2F hybrid integrated circuit assembly in accordance with an embodiment of the present disclosure. In FIG. 19, the integrated circuit assembly 700 includes a substrate 702 having a top surface and a bottom surface. The integrated circuit assembly 700 also includes a first die 704 that is wire bonded to the top surface of the substrate 702. The first die 704 includes a first redistribution layer (RDL) 750 having both at least a plurality of wire bond pads 710 and a plurality of solder pads 712. The first RDL can be comprised of an aluminum (i.e., Al RDL). The integrated circuit assembly 700 also includes a second die 730 that is operatively coupled to the first die 704 via the first RDL 750 via a plurality of bumps 732.

In one example, the second die 730 is configured with a second redistribution layer 760 having a plurality of solder pads 712 that permits reflow of the plurality of bumps 732. The second RDL can be comprised of an aluminum or copper (i.e., Al RDL or Cu RDL). The plurality of bumps 732 are disposed in a non-peripheral orientation on the second die 730 and are comprised of eutectic bumps or other suitable solder such as leadfree bumps (which can be comprised of alloys such as Sn/Ag, Sn/Cu, etc). As used herein, the term "eutectic" refers to a common solder alloy (e.g., tin and lead) having low melting points. In this example, the second die 730 can be a flip chip die. Thereafter, external connection will be wire bonded 715 to the substrates, and then, routed to the BGA balls 714 on the substrates.

In another example, as illustrated in FIG. 20, the plurality of bumps 733 are disposed on a periphery of the second die 731. In this example, such bumps 733 are comprised of at least a plurality of copper stud bumping and/or a plurality of gold stud bumping. In this example, the second die 731 can be a flip chip die, and there need not be any RDL present in the second die 731. The other reference elements of the integrated circuit assembly 701 represented in FIG. 20 are similar to that described above with respect to FIG. 19.

Figure 21:
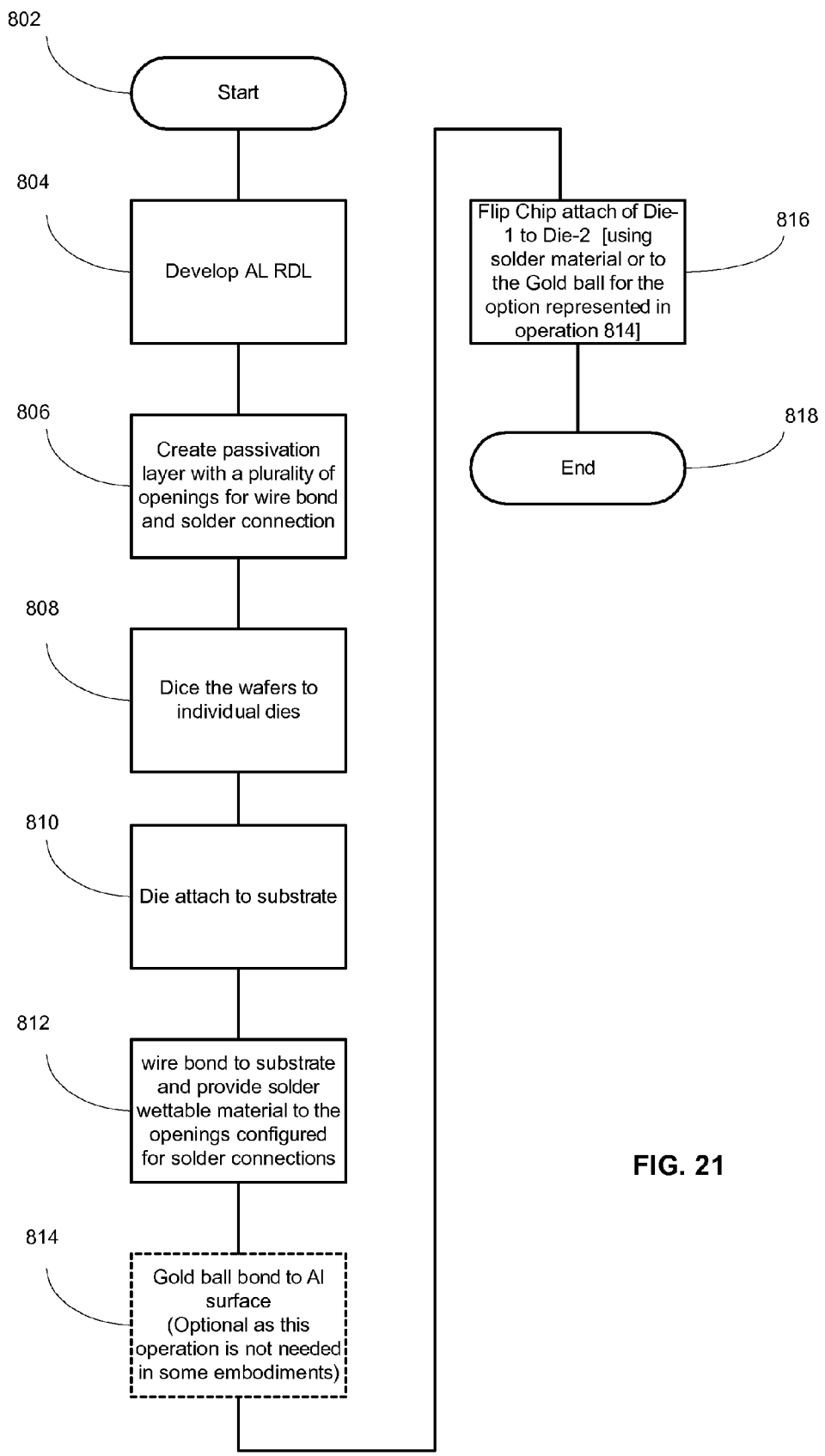
FIG. 21 illustrates in flow-chart form a process for making an integrated circuit product according to an embodiment of the present disclosure.

FIG. 21 illustrates in flow-chart form a process for making an integrated circuit product according to an embodiment of the present disclosure. The process starts in operation 802. In operation 804, an aluminum redistribution layer (RDL) is formed on a wafer. In operation 806, a passivation layer is created on the aluminum RDL such that the passivation layer can include a plurality of openings for wire bond and solder connections to the aluminum RDL. In operation 808, the wafer is then diced to individual dies. Each diced die is attached to a substrate, in operation 810. Thereafter, in operation 812, gold wire can be bonded to each of the openings configured for wire bonding, and solder wettable material can be provided to the openings configured for solder connections. As an option, in operation 814, the solder material can include a plurality of gold balls that permit reflow of a plurality of bumps on the aluminum RDL. In an example, the solder material can include a layer of copper RDL that permits solder reflows of the plurality of bumps to the copper RDL. In yet another example, the solder material includes a layer of silver RDL that permits solder reflows of a plurality of bumps to the silver RDL. In operation 816, a plurality of bumps associated with a flip chip are then attached to the solder material. The process ends in operation 818. It will be recognized that the operations may be performed in any suitable order and that other fabrication techniques may be employed as desired.

Figure 22:
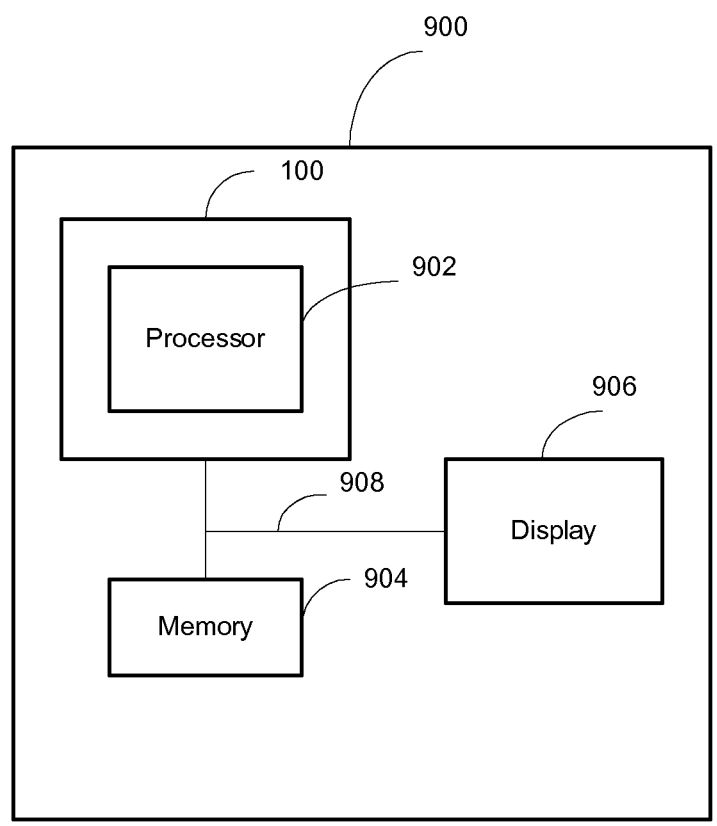
FIG. 22 illustrates a functional block diagram of an exemplary device that implements a F2F hybrid integrated circuit in accordance with an embodiment of the present disclosure.

Referring now to FIG. 22, the integrated circuit 100 may be implemented in a device 900 such as a wireless phone, a mobile and/or stationary computer, a printer, a LAN interface (wireless and/or wired), a media player, a video decoder and/or encoder, and/or any other suitable device. The device 900 may include, among other things, a processor 902 such as a graphics processor (or core) and/or one or more central processing units (or cores) or any suitable circuitry. The processor 902 may be implemented in the integrated circuit 100. More specifically, the dies 130, 102 of the integrated circuit 100 may include the processor 902.

Also, integrated circuit design systems (e.g., work stations) are known that create integrated circuits based on executable instructions stored on a computer readable memory such as but not limited to CDROM, RAM, other forms of ROM, hard drives, distributed memory etc. The instructions may be represented by any suitable language such as but not limited to hardware descriptor language or other suitable language. As such, the redistribution layer(s) described herein may also be produced as integrated circuits by such systems. For example, an integrated circuit 100 may be created for use in a device 900 using instructions stored on a computer readable medium that when executed cause an integrated circuit design system to create an integrated circuit that is operative to distribute, via a redistribution layer (RDL) comprised of at least one conductive layer, electrical information from one location to another location in the IC, the RDL having both at least a plurality of wire bond pads and a plurality of solder pads, wherein the plurality of solder pads each comprise a solder wettable material in direct electrical communication with the RDL. Integrated circuits having redistribution layers that perform other operations described herein may also be suitably produced.

The device 900 may also include memory 904 such as RAM, ROM, static, discrete logic, dynamic, low latency non-volatile memory such as flash and/or any suitable optical magnetic or electronic data storage that stores executable instructions that may be executed by one or more processors 902. The memory 904 may also include non local memory such as networked memory available via an intranet server, Internet server or any suitable non local memory. Although not depicted, the memory 904 may also be implemented in the integrated circuit 100.

The device 900 may also include a display 906 and/or any other suitable circuits, interfaces, structures or functional operations. The processor 902, memory 904, and/or display 906 may communicate via a bus 908 and/or any other suitable communication mechanism whether the bus is local, wireless, a network connection or any suitable link.

As noted above, the integrated circuit 100, among other advantages, has a definable structure that provides improved space savings and electrical performance than known integrated circuit products, assembly and method employing die stacking. The die stacking structure used in the embodiments of the present disclosure may also help provide shorter routing of interconnections between circuits resulting in faster signal propagation and reduction in noise and cross-talk. Such die stacking structures also provide improved flexibility for system designers that desire to alter pad pitches. Further, costs are reduced by minimizing the number of substrates that can be used to form an RDL that includes a plurality of wire bond pads and a plurality solder pads.

While this disclosure includes particular examples, it is to be understood that the disclosure is not so limited. Numerous modifications, changes, variations, substitutions and equivalents will occur to those skilled in the art without departing from the spirit and scope of the present disclosure upon a study of the drawings, the specification and the following claims.

What is claimed is:

1. An integrated circuit (IC), comprising:
a redistribution layer (RDL) comprised of at least one conductive layer configured to distribute electrical information from one location to another location in the IC, the RDL having both at least a plurality of wire bond pads and a plurality of solder pads, and wherein the IC comprises a solder wettable material in direct electrical communication with the RDL;
the plurality of wire bond pads are adapted to each receive a gold or gold based alloy wire bond;
the RDL comprises aluminum or aluminum alloy;
the plurality of solder pads are each adapted to receive a plurality of solder bumps associated with a flip chip;
wherein the solder wettable material permits reflow of the plurality of solder bumps on the RDL; and
wherein the RDL is further comprised of a layer of silver or silver alloy having the plurality of wire bond pads and the plurality of solder pads.

2. The integrated circuit according to claim 1, wherein the solder wettable material is comprised of a layer of copper.

3. The integrated circuit according to claim 1, wherein the electrical information is comprised of at least one of signals, power and/or ground information.

4. An integrated circuit (IC), comprising:
a redistribution layer (RDL) having both at least a plurality of wire bond pads and a plurality of solder pads, the RDL configured to be comprised of a layer of silver having the plurality of wire bond pads and the plurality of solder pads;
an aluminum layer disposed below the layer of silver and in electrical contact therewith; and
a flip chip having a plurality of solder bumps for mounting to the plurality of solder pads of the RDL, wherein the plurality of solder pads permit solder reflows of the plurality of bumps to the silver RDL.

5. The integrated circuit of claim 4 wherein the silver layer is comprised of a silver alloy.

6. The integrated circuit of claim 4 wherein the aluminum layer is comprised of an aluminum alloy.

7. An integrated circuit assembly, comprising:
a substrate comprising a top surface and a bottom surface;
a first die, wirebonded to the top surface of the substrate, comprising a first redistribution layer (RDL) having both at least a plurality of wire bond pads and a plurality of solder pads;
the first RDL configured to be comprised of a layer of silver having the plurality of wire bond pads and the plurality of solder pads; and
an aluminum layer disposed below the layer of silver and in electrical contact therewith; and
a second die, operatively coupled to the first die via the first RDL via a plurality of bumps.

8. The integrated circuit assembly of claim 7, wherein the second die is comprised of second redistribution layer having a plurality of solder pads that permits reflow of the plurality of bumps.

9. The circuit assembly of claim 8, wherein the plurality of bumps are disposed in a non-peripheral orientation on the second die and are comprised of at least one of eutectic bumps and/or leadfree bumps.

10. The circuit assembly of claim 7, wherein the second die is a flip chip die.

11. The circuit assembly of claim 7, wherein the plurality of bumps, disposed on a periphery of the second die, are comprised of at least a plurality of copper stud bumping and/or a plurality of gold stud bumping.

12. The integrated circuit assembly of claim 7 wherein the aluminum layer is comprised of an aluminum alloy.

13. The integrated circuit assembly of claim 7 wherein the silver layer is comprised of a silver alloy.

* * * * *